(12) United States Patent
Baek et al.

(10) Patent No.: US 7,982,386 B2
(45) Date of Patent: Jul. 19, 2011

(54) ORGANIC LIGHT EMITTING DISPLAY DEVICE WITH OPAQUE ELECTRODES

(75) Inventors: Ji-Yeon Baek, Yongin-si (KR); Jun-Woo Lee, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 640 days.

(21) Appl. No.: 11/728,628

(22) Filed: Mar. 26, 2007

(65) Prior Publication Data

US 2008/0111475 A1    May 15, 2008

(30) Foreign Application Priority Data

Nov. 10, 2006    (KR) .................. 10-2006-0111153

(51) Int. Cl.
*H05B 33/00* (2006.01)
*H05B 33/06* (2006.01)

(52) U.S. Cl. ........ 313/503; 313/500; 313/504; 313/506; 313/512; 257/79; 257/88; 257/89; 428/690

(58) Field of Classification Search ................ 313/504, 313/506

See application file for complete search history.

(56) References Cited

U.S. PATENT DOCUMENTS

| | | | |
|---|---|---|---|
| 6,858,898 B1 * | 2/2005 | Hayakawa et al. | 257/347 |
| 7,221,423 B2 * | 5/2007 | Park et al. | 349/139 |
| 2003/0132927 A1 * | 7/2003 | Ouchi et al. | 345/204 |
| 2003/0137255 A1 | 7/2003 | Park et al. | |
| 2005/0057460 A1 * | 3/2005 | Lee et al. | 345/76 |
| 2005/0067945 A1 * | 3/2005 | Nishikawa et al. | 313/501 |
| 2005/0127828 A1 * | 6/2005 | Chung et al. | 313/504 |
| 2005/0162580 A1 * | 7/2005 | Kim et al. | 349/43 |

FOREIGN PATENT DOCUMENTS

| | | |
|---|---|---|
| JP | 2002-289344 A | 10/2002 |
| JP | 2003-131261 | 5/2003 |
| JP | 2003-208109 A | 7/2003 |
| JP | 2005-099317 A | 4/2005 |
| JP | 2005-157298 A | 6/2005 |
| JP | 2005-181422 | 7/2005 |
| KR | 10-2000-0005852 | 1/2000 |
| KR | 10-2003-0067547 | 8/2003 |
| KR | 10-2005-0021718 | 3/2005 |
| KR | 10-2005-0050015 | 5/2005 |
| KR | 10-2006-0026243 | 3/2006 |

* cited by examiner

*Primary Examiner* — Sikha Roy
(74) *Attorney, Agent, or Firm* — Knobbe Martens Olson & Bear LLP

(57) ABSTRACT

An organic light emitting display device is disclosed. One embodiment of the organic light emitting display device includes a substrate member in which a plurality of pixel regions are arranged, and a plurality of thin film transistors which are formed on the pixels regions, respectively. The device also includes a data line which is arranged along one side edge of each of the pixel region and a common power source line which is arranged along the other side edge of each of the plurality of pixel regions and is substantially parallel to the data line. The device further includes a first pixel electrode which is electrically connected to one of the plurality of thin film transistors and is formed in each region of the pixel regions. The device also includes an organic film which is formed on the first pixel electrode, and a second pixel electrode which is formed on the organic film. One side edge of the first pixel electrode which is close to the data line is overlapped with the data line.

14 Claims, 3 Drawing Sheets

ORGANIC LIGHT EMITTING DISPLAY DEVICE WITH OPAQUE ELECTRODES

CROSS-REFERENCE TO RELATED APPLICATIONS

This application claims priority to and the benefit of Korean Patent Application No. 10-2006-0111153 filed in the Korean Intellectual Property Office on Nov. 10, 2006, the entire disclosure of which is incorporated herein by reference.

BACKGROUND

1. Field

The present disclosure relates to an organic light emitting display device, and more particularly, to an organic light emitting display device having thin film transistors with improved driving characteristics.

2. Description of the Related Technology

Recently, flat panel displays have been spotlighted as next generation display devices. A plasma display panel (PDP), a liquid crystal display (LCD), an organic light emitting display device are representative examples of the flat panel displays.

An organic light emitting display device is a self-luminescent device, which displays an image by using a light-emitting organic compound. The organic light emitting display device can provide a viewing angle wider than those of other flat panel displays and implement a high resolution display. Organic light emitting display devices can be classified into an active matrix (AM) type and a passive matrix (PM) type based on the driving method. In addition, organic light emitting display devices can be classified into a top emission type, a bottom emission type, and a dual emission type based on the direction of light emission.

A pixel is a basic unit for displaying an image. Generally, in an AM type organic light emitting display device, a pixel generally includes an organic light emitting diode which emits light and a circuit unit which drives the organic light emitting diode.

Generally, the circuit unit includes two or more thin film transistors (TFTs) and one capacitor. One of the two TFTs serves as a switching element which selects an organic light emitting diode of a pixel among a plurality of pixels which needs to emit light. The other TFT serves as a driving circuit which applies a driving power source to the selected organic light emitting diode to emit light.

The organic light emitting diode includes an anode electrode from which holes are injected, a cathode electrode from which electrons are injected, and an organic film interposed between the anode and cathode electrodes.

In the organic light emitting display device described above, light emitting from the organic light emitting diode may reach the channel regions of the TFTs. When the light reaches the channel regions of the TFTs, a photo leakage current may occur, thereby deteriorating the driving characteristics of the TFTs.

SUMMARY OF CERTAIN INVENTIVE ASPECTS

One aspect of the invention provides an organic light emitting display device capable of blocking light from reaching channel regions of TFTs to prevent generation of a photo leakage current and deterioration of driving characteristics of the TFTs.

Another aspect of the invention provides an organic light emitting display device comprising: an array of pixels formed over a substrate, each of the pixels comprising an organic light emitting diode (OLED), the OLED comprising a first pixel electrode, a second pixel electrode overlying the first pixel electrode, and an organic light emitting layer interposed between the first and second pixel electrodes, the first electrode comprising a layer formed of a substantially opaque material; and at least one thin film transistor (TFT) interposed between the substrate and one of the pixels; and wherein the first pixel electrode of the one pixel is configured to substantially block light emitting from the organic light emitting layer from reaching the thin film transistor.

The first pixel electrode may be configured to sufficiently block the light from reaching the TFT such that substantially no photo leakage current occurs at the TFT. The first pixel electrode may at least partially overlie the TFT. The TFT may comprise a semiconductor layer including a channel region, and the first pixel electrode may overlie substantially the entire portion of the channel region. The first pixel electrode may overlie substantially the entire portion of the TFT.

The first pixel electrode may have a first edge portion, and the device may further comprise a data line extending along the first edge portion while at least partially overlapping with the first edge portion in a direction substantially perpendicular to the substrate. The data line may be electrically connected to the TFT. The first pixel electrode may substantially overlie the data line. The first pixel electrode may have a second edge portion on the opposite side from the first edge portion, and the device may further comprise a common power source line extending along the second edge portion while at least partially overlapping with the second edge portion in a direction substantially perpendicular to the substrate.

The common power source line may be electrically connected to the TFT. The TFT may be positioned under the first pixel electrode between the first and second edge portions thereof, and the first pixel electrode may overlie substantially the entire portion of the TFT. The device may further comprise another common power source line extending adjacent to and substantially parallel to the data line while at least partially overlapping with the first edge portion in a direction substantially perpendicular to the substrate.

The substantially opaque material may be silver (Ag) or a silver alloy. The first electrode may further comprise a layer formed of a substantially transparent material. The substantially transparent material may be indium tin oxide (ITO). The first electrode may have an ITO/Ag/ITO layer structure.

Another aspect of the invention provides an organic light emitting display device comprising: a plurality of data lines formed over a substrate, the data lines extending substantially parallel to one another; and a plurality of power lines formed over the substrate, the power lines extending substantially parallel to one another and to the data lines, the power lines alternating with the data lines; and an array of organic light emitting diodes (OLEDs), each of the OLEDs comprising a first pixel electrode, a second pixel electrode overlying the first pixel electrode, and an organic light emitting layer interposed between the first and second pixel electrodes, the first electrode comprising a layer formed of a substantially opaque material, at least one of the first pixel electrodes having a first edge portion and a second edge portion on the opposite side from the first edge portion, the first and second edge portions extending substantially parallel to the data lines, wherein the first edge portion at least partially overlaps with one of the data lines, and wherein the second edge portion at least partially overlaps with one of the power lines, the one power line being second closest to the one data line.

The first edge portion may further overlap with another of the power lines, the other power line being closest to the one data line. The device may further comprise at least one thin film transistor formed over the substrate and under the at least one first pixel electrode. The at least one first pixel electrode may be configured to substantially block light emitting from the organic light emitting layer from reaching the thin film transistor.

Another aspect of the invention provides an organic light emitting display device including a substrate member in which a plurality of pixel regions are arranged; a plurality of thin film transistors which are formed on the pixels regions, respectively; a data line which is arranged along one side edge of each of the plurality of pixel region; a common power source line which is arranged along the other side edge of each of the plurality of pixel regions and is substantially parallel to the data line; a first pixel electrode which is electrically connected to one of the thin film transistors and formed in each region of the plurality of pixel regions; an organic film which is formed on the first pixel electrode; and a second pixel electrode which is formed on the organic film. One side edge of the first pixel electrode which is close to the data line is overlapped with the data line.

The one side edge of the first pixel electrode which overlaps with the data line may be formed to cross the data line. The other side edge of the first pixel electrode which is close to the common power source line and faces the one side may be overlapped with the common power source line. An end of the one side edge of the first pixel electrode which is formed to cross the data line may be overlapped with the common power source line of an adjacent pixel region. In addition, the first pixel electrode may be overlapped with the thin film transistors. In addition, the first pixel electrode may be made of materials including conductive reflective materials, and the second pixel electrode may be made of materials including conductive transparent materials. Accordingly, the deterioration of driving characteristics of the TFTs can be prevented.

DETAILED DESCRIPTION OF CERTAIN INVENTIVE EMBODIMENTS

Figure 1:
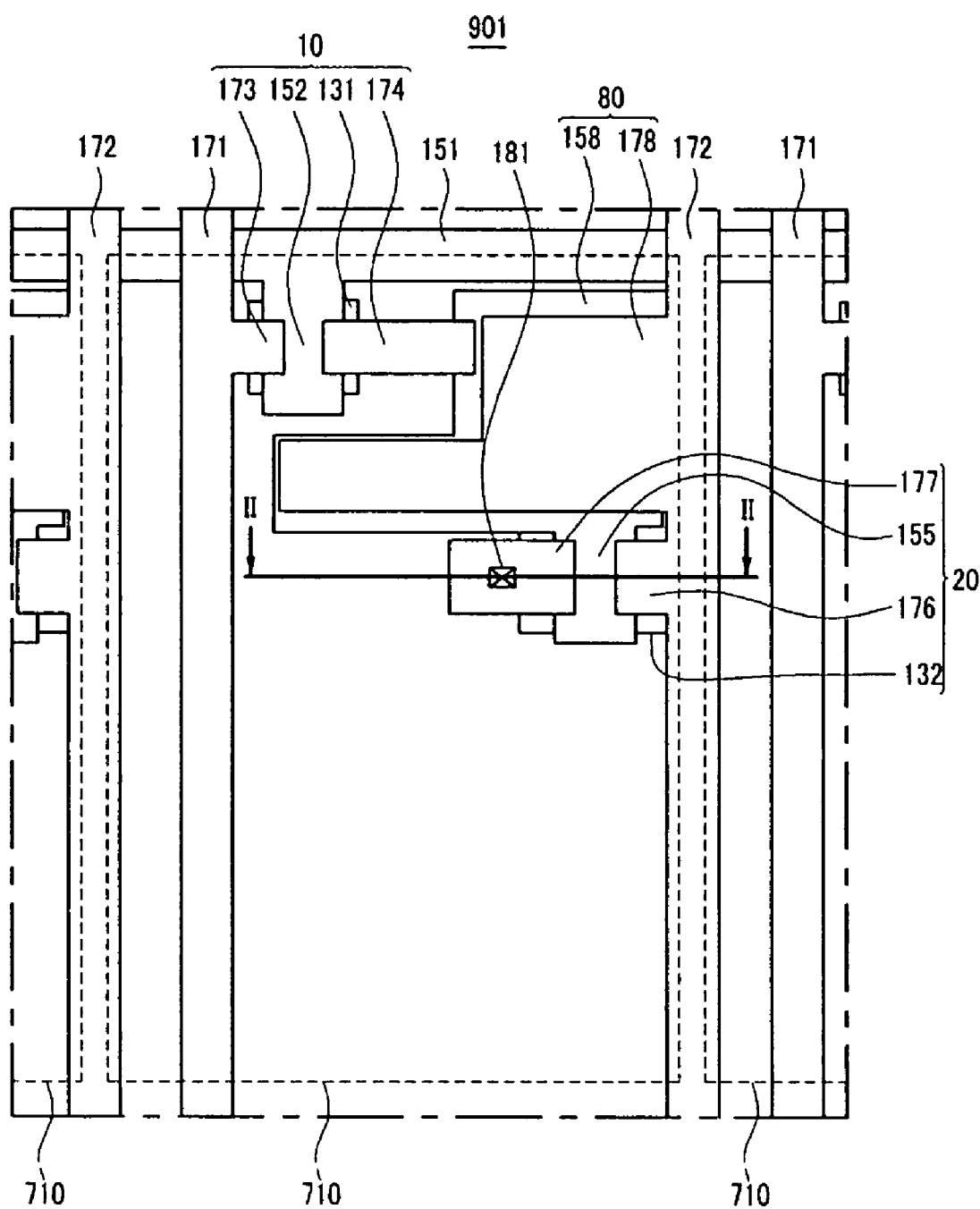
FIG. 1 is a top plan view illustrating an organic light emitting display device according to one embodiment.

Hereinafter, exemplary embodiments will be described in detail with reference to the attached drawings. The invention may be embodied and modified in a variety of forms, and they are not intended to limit the invention.

In the attached drawings, an organic light emitting display device including PMOS thin film transistors (TFTs) is illustrated. However, the present disclosure is not limited thereto and may be applied to NMOS or CMOS TFTs.

In addition, in the attached drawings, although active matrix (AM) type organic light emitting display devices having 2TR-1Cap structures, each of which includes two TFTs and one capacitor for one pixel are illustrated, the present disclosure is not limited thereto. Accordingly, the organic light emitting display device may include three or more TFTs and two or more capacitors in one pixel. The organic light emitting display device may have various structures with additional wirings.

In the drawings, like reference numerals indicate identical or functionally similar elements throughout the specification.

In the drawings, the thickness of layers, films, panels, regions, etc. may be exaggerated for clarity. It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
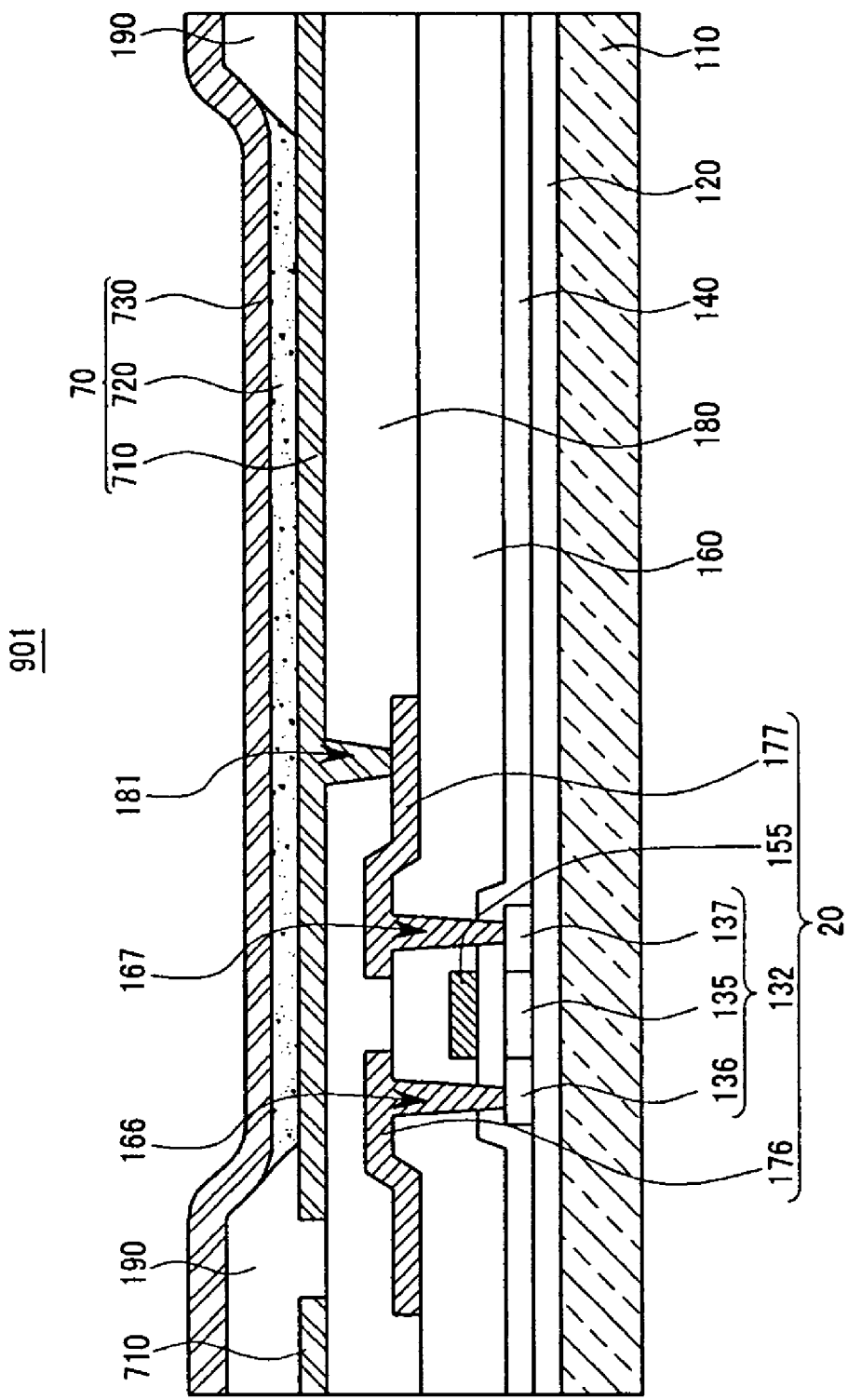
FIG. 2 is a cross-sectional view taken along the line II-II of FIG. 1.

FIG. 1 is a schematic diagram illustrating a pixel of an organic light emitting display device having a plurality of pixels according to a first exemplary embodiment. FIG. 2 is a cross-sectional view taken along the line II-II of FIG. 1.

As illustrated in FIG. 1, the organic light emitting display device 901 includes a first TFT 10, a second TFT 20, a capacitor 80, and an organic light emitting diode (OLED) 70. In addition, the organic light emitting display device 901 further includes a gate line 151 extending along one direction, a data line 171 crossing the gate line 151 while being insulated therefrom, and a common power source line 172. Here, a region defined by the gate, data, and common power source lines 151, 171, and 172 may form one pixel region. However, the region defined by the gate, data, and common power source lines 151, 171, and 172 does not necessarily form a pixel region. There may be various configurations of pixel regions, based on an operating method of the organic light emitting display device 901, that is, whether the organic light emitting display device 901 is a top emission type or a bottom emission type. In addition, the pixel region may be changed based on the structure of a circuit unit including the first TFT 10, the second TFT 20, and the capacitor 80. In the embodiment described above, a region where a first pixel electrode 710 (denoted by a dotted line) is positioned can be defined as a pixel region.

In the illustrated embodiment, the data line 171 extends along one side edge of one pixel region. The common power source line 172 may extend along the other side edge of the pixel region. The common power source line 172 may run substantially parallel to the data line 171. The illustrated common power source line 172 overlaps partly with one pixel region and partly with another neighboring pixel region. In other words, the data line 171 and the common power source line 172 are positioned along two opposing edges of one pixel region.

The OLED 70 (FIG. 2) includes an anode electrode from which holes are injected, a cathode electrode from which electrons are injected, and an organic film interposed between the anode and cathode electrodes. The holes and electrons are injected into the organic film from the anode and cathode electrodes, respectively. When excitons which are generated from recombining the injected holes and electrons return from an excited state to a ground state, light emission occurs.

The capacitor 80 includes first and second storage electrodes 158 and 178 with an insulation film 140 (illustrated in FIG. 2) interposed therebetween.

Each of the first and second TFTs 10 and 20 includes a gate electrode 152 and 155, a source electrode 173 and 176, a drain electrode 174 and 177, and a semiconductor film 131 and 132. It will be appreciated that various configurations of TFTs are adapted for the first and second TFTs 10, 20.

The first TFT 10 is used as a switching element for selecting a pixel for light emission. The first gate electrode 152 of the first TFT 10 is electrically connected to the gate line 151. The first source electrode 173 is connected to the data line 171. The first drain electrode 176 of the first TFT 10 is connected to the first storage electrode 158 of the capacitor 80.

The second TFT 20 is configured to apply a driving power source to a first pixel electrode 710 for light emission of an organic film 720 (illustrated in FIG. 2) of the selected OLED 70. Here, the first pixel electrode 710 can serve as an anode of the OLED 70. In other embodiments, the first pixel electrode 710 may be used as a cathode of the OLED 70 depending on the method of driving the organic light emitting display device 901. The second gate electrode 155 of the second TFT 20 is connected to the first storage electrode 158 of the capacitor 80. The second source electrode 176 is connected to the common power source line 172.

A planarization film 180 (illustrated in FIG. 2) is formed over the substrate, covering the TFTs 10, 20. The pixel electrode 710 of the OLED 70 is formed over the planarization film 180. In addition, the second drain electrode 177 of the second TFT 20 is connected to the first pixel electrode 710 of the OLED 70 through a contact hole 181 in the planarization film 180.

In the illustrated embodiment, the first TFT 10 is driven by a gate voltage which is applied to the gate line 151 to transfer a data voltage which is applied to the data line 171 to the second TFT 20. A voltage corresponding to a difference between the common voltage which is applied to the second TFT 20 from the common power source line 172 and the data voltage which is transferred from the first TFT 10 is stored in the capacitor 80. A current corresponding to the voltage stored in the capacitor 80 flows into the OLED 70 through the second TFT 20, so that the OLED 70 emits light.

In addition, the organic light emitting display device 901 further includes a pixel defining layer 190 (illustrated in FIG. 2) formed over the planarization film 180. The pixel defining layer 190 has an opening and partitions pixels.

In the illustrated embodiment, one side edge of the first pixel electrode 710 in a pixel region overlaps with the data line 171 crossing the pixel region. The side edge of the first pixel electrode 170 which overlaps with the data line 171 crosses the data line 171, so that an end of the side edge also overlaps with the common power source line 172 of an adjacent pixel region.

In addition, the other side edge of the first pixel electrode 710 overlaps with the common power source line 172 crossing the pixel region. Here, the side edges of the first pixel electrode 710 are positioned on opposite sides of the pixel region.

In addition, the first pixel electrode 710 overlaps with the first and second TFTs 10 and 20. In other words, the first pixel electrode 710 covers the first and second TFTs 10 and 20 when viewed from above the first pixel electrode 710. Here, the first pixel electrode 710 is formed of a reflective conductive material through which substantially no light can pass.

The aforementioned structure prevents light generated from the OLED 70 from reaching the channel regions of the TFTs 10 and 20. In other words, the first pixel electrode 710 of the OLED 70 covers the TFTs 10 and 20, and extends to over the data line 171 and the common power source line 172 on boundaries of the pixel region. Accordingly, the first pixel electrode 710 blocks the light generated from the OLED 70 from reaching the channel regions of the TFTs 10 and 20.

A structure of an organic light emitting display device 901 according to a first embodiment will now be described in detail with reference to FIG. 2. FIG. 2 illustrates a second TFT 20, an OLED 70, and a capacitor 80 of the organic light emitting display device.

The structure of a TFT will now be described, referring to the second TFT 20. Since the structure of the first TFT 10 is the same as that of the second TFT 20, detailed description on the first TFT 10 will be omitted. In FIG. 2, a substrate member 110 may be formed of an insulation substrate or a metal substrate. The insulation substrate may be formed of glass, quartz, ceramic, plastic, or the like. The metal substrate may be formed of stainless steel.

A buffer layer 120 may be formed on the substrate member 110. The buffer layer 120 prevents penetration of impurities while planarizing the upper surface of the substrate member 110. The buffer layer 120 may be formed of any material suitable for the above functions. In certain embodiments, the buffer layer 120 may be omitted depending on the type of the substrate member 110 and manufacturing conditions.

A semiconductor layer 132 may be formed on the buffer layer 120. The semiconductor layer 132 may be formed of a polycrystalline silicon film. Here, the semiconductor layer 132 may be formed by coating amorphous silicon, and patterning and crystallizing the coated amorphous silicon. The semiconductor layer 132 includes a channel region 135, a source region 136, and a drain region 137. The source and drain regions 136, 137 may be formed by p+ doping both sides of the channel region 135. The doping ion material may be a p-type impurity such as boron (B). $B_2H_6$ may be used as a doping ion material. The impurity can vary depending on the type of the TFT.

A gate insulation substrate 140 which is made of silicon oxide or silicon nitride is formed on the semiconductor layer 132. A gate wiring including the gate electrode 155 is formed on the gate insulation substrate 140. The gate wiring includes a gate line 151 (illustrated in FIG. 1), a first storage electrode 158 (illustrated in FIG. 1) and other wirings, although not illustrated in FIG. 2. The gate electrode 155 overlaps with at least a part of the semiconductor layer 132, more particularly, the channel region 135.

Although not illustrated in FIG. 2, the gate wiring may have multi-layers. For example, aluminum or aluminum alloy may be used as a lower layer. Molybdenum-tungsten or molybdenum-tungsten nitride may be used as an upper layer. Aluminum or aluminum alloy which has a low resistivity is used as the lower layer to prevent a signal resistance due to wiring resistance. Molybdenum-tungsten or molybdenum-tungsten nitride has high corrosion resistance to chemicals. These can be used for the upper layer in order to reinforce weak portions formed of aluminum or aluminum alloy. Aluminum or aluminum alloy has a low corrosion resistance to chemicals and is easily oxidized to cause disconnection. Recently, molybdenum, aluminum, titanium, tungsten, and the like have been spotlighted as wiring materials.

An interlayer insulation film 160 which covers the gate electrode 155 is formed on the gate insulation film 140. The gate insulation film 140 and the interlayer insulation film 160 have contact holes 166 and 167 through which the source region 136 and drain region 137 of the semiconductor layer 132 are exposed. Here, a contact hole through which the source region 136 is exposed is referred to as a first contact hole 166. A contact hole through which the drain region 137 is exposed is referred to as a second contact hole 167.

A data wiring including the source and drain electrodes 176 and 177 is formed on the interlayer insulation film 160. In addition, the data wiring may include a data line 171 (illustrated in FIG. 1), a common power source line 172 (illustrated in FIG. 1), a second storage electrode 178 (illustrated in FIG. 1) and other wirings, although not illustrated in FIG. 2. The source and drain electrodes 176 and 177 are connected to the source and drain regions 136 and 137 of the semiconductor layer 132 through the contact holes 166 and 167, respectively. In certain embodiments, the data wiring may have a multi-layered structure.

However, the structures of the gate and data wirings are not limited to those described above. Accordingly, the structures of the gate and data wirings may vary, depending on structures of the first and second TFTs 10 and 20 and other wirings. In other words, the gate line, data line, common power source line, and other elements may be formed on a layer which is different from the layer in the embodiment. The semiconductor layer 132, the gate electrode 155, the source electrode 176, and the drain electrode 177 which are formed as described above form the second TFT 20.

The planarization film 180 which covers the data wirings 176 and 177 is formed on the interlayer insulation film 160. The planarization film 180 provides a planar top surface, covering underlying structure and layers. The film 180 may also serve to increase the light emission efficiency of the OLED 70 which is to be formed on the film 180. In addition, the planarization film 180 has a contact hole 181 which exposes a portion of the drain electrode 177. Hereinafter, the contact hole 181 may be referred to as a third contact hole.

The planarization film 180 may be formed of any suitable material having superior characteristics of planarization. The planarization film 180 allows the organic film 720 to have a uniform thickness over the planarization film 180. As a result, the organic film 720 may have uniform brightness, thereby increasing its light emitting efficiency. In addition, a defect such as a break and short-circuit between several conductive layers to be formed on the planarization film 180 can be prevented.

A first pixel electrode 710 of the OLED 70 may be formed on the planarization film 180. The first pixel electrode 710 may be connected to the drain electrode 177 through the third contact hole 181 of the planarization film 180. A pixel defining layer 190 which has a plurality of openings and defines pixels is formed on the planarization film 180 and a portion of the first pixel electrode 710. Here, at least a portion of the first pixel electrode is exposed through the opening of the pixel defining layer 190.

In the opening of the pixel defining layer 190, an organic film 720 is formed on the first pixel electrode 710. A second pixel electrode 730 is formed on the pixel defining layer 190 and the organic film 720. Here, the second pixel electrode 730 becomes a cathode electrode of the OLED 70. In other words, the OLED 70 includes the first pixel electrode 710, the organic film 720, and the second pixel electrode 730.

The first pixel electrode 710 may be formed of reflective conductive materials. The second pixel electrode 730 may be formed of materials including transparent conductive materials. Examples of the transparent conductive materials include, but are not limited to, Indium Tin Oxide (ITO), Indium Zinc Oxide (IZO), ZnO, and $In_2O_3$ (Indium Oxide).

The organic film 720 may be formed of a low molecular weight organic compound or a polymeric compound. The organic film 720 may have multi-layers including a light emitting layer and at least one of a hole-injection layer (HIL), a hole-transporting layer (HTL), an electron-transporting layer (ETL), and an electron-injection layer (EIL). In certain embodiments, the HIL is formed on the first pixel electrode 710. The HTL, the light emitting layer, the ETL, and the EIL may be sequentially stacked over the HIL.

A sealing member may be further formed on the second pixel electrode 730, although not illustrated in FIG. 2.

Figure 3:
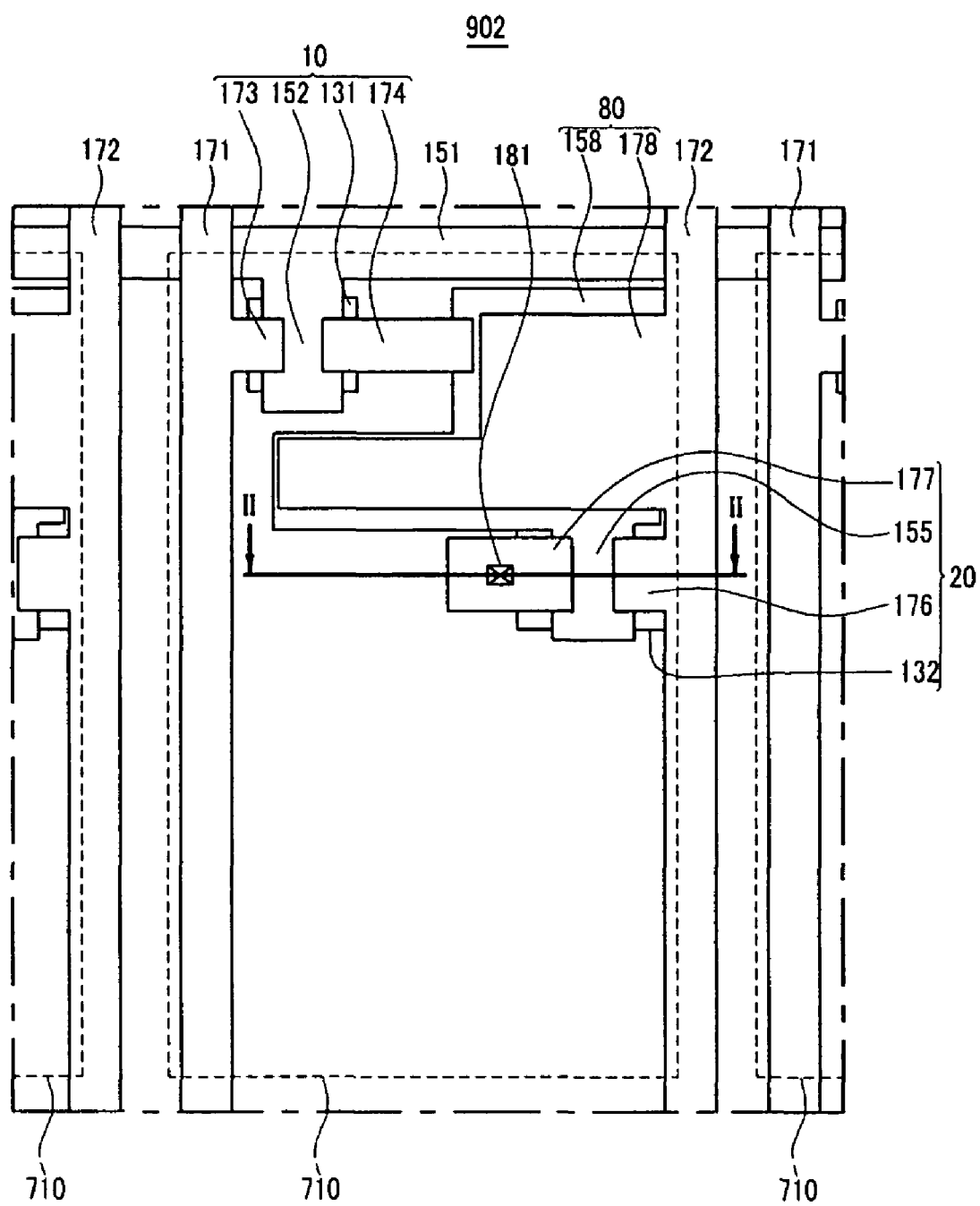
FIG. 3 is a top plan view illustrating an organic light emitting display device according to another embodiment.

An organic light emitting display device 902 according to a second embodiment will now be described with reference to FIG. 3. One side edge of the first pixel electrode 710 of a pixel region overlaps with the data line 171 crossing the pixel region, as illustrated in FIG. 3. The side edge of the first pixel electrode 170 which overlaps with the data line 171 may cross the data line 171. An end of the side edge may overlap with the data line although not illustrated in FIG. 2. In other words, one side edge of the first pixel electrode 710 does not overlap with the common power source line 172 of an adjacent pixel region.

In addition, the other side edge of the first pixel electrode 710 overlaps with the common power source line 172. Here, the edges of the one side and the other side of first pixel electrode 710 are positioned on opposite sides of the pixel region.

The aforementioned structure prevents light generated from the OLED 70 from reaching the channel regions of the TFTs 10 and 20. In other words, the first pixel electrode 710 of the OLED 70 is formed to cover the TFTs 10 and 20 while overlapping with the data line 171 and the common power source line 172 on a boundary of the pixel region. Accordingly, the first pixel electrode 710 blocks the light from reaching the channel regions of the TFTs 10 and 20.

As described above, an organic light emitting display device according to an embodiment blocks light from reaching the channel regions of TFTs, thereby preventing a photo leakage current. This configuration prevents deterioration of driving characteristics of the TFTs. In other words, the first pixel electrode of the OLED is formed to cover the TFTs while overlapping with the data line and the common power source line on a boundary of the pixel region. Accordingly, the first pixel electrode can block the light generated by the OLED from reaching the channel regions of the TFTs due to reflection.

While the instant disclosure has been described in connection with exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light emitting display device, comprising:
    an array of pixels formed over a substrate, each of the pixels comprising an organic light emitting diode (OLED), the OLED comprising a first pixel electrode, a second pixel electrode overlying the first pixel electrode, and an organic light emitting layer interposed between the first and second pixel electrodes, the first pixel electrode comprising a layer formed of a substantially opaque material;
    at least one thin film transistor (TFT) interposed between the substrate and one of the pixels;
    a data line connected to the TFT; and
    first and second common power source lines, formed over the substrate and extending adjacent to and substantially parallel to the data line,
    wherein the first pixel electrode of the one pixel extends across at least the entire width of the data line, partially overlaps the first and second common power source lines, and is configured to substantially block light emitting from the organic light emitting layer from reaching the thin film transistor.

2. The device of claim 1, wherein the first pixel electrode is configured to sufficiently block the light from reaching the TFT such that substantially no photo leakage current occurs at the TFT.

3. The device of claim 1, wherein the first pixel electrode at least partially overlies the TFT.

4. The device of claim 3, wherein the TFT comprises a semiconductor layer including a channel region, and wherein the first pixel electrode overlies substantially the entire channel region.

5. The device of claim 3, wherein the first pixel electrode overlies substantially the entire portion of the TFT.

6. The device of claim 1, further comprising a second thin film transistor (TFT), wherein the common power source line is electrically connected to the second TFT.

7. The device of claim 1, wherein the TFT is positioned under the first pixel electrode, and wherein the first pixel electrode overlies substantially the entire TFT.

8. The device of claim 1, wherein the substantially opaque material comprises silver (Ag) or a silver alloy.

9. The device of claim 1, wherein the first pixel electrode further comprises a layer formed of a substantially transparent material.

10. The device of claim 9, wherein the substantially transparent material comprises indium tin oxide (ITO).

11. The device of claim 10, wherein the first electrode has an ITO/Ag/ITO layer structure.

12. An organic light emitting display device comprising:
a plurality of data lines formed over a substrate, the data lines extending substantially parallel to one another; and
a plurality of power lines formed over the substrate, the power lines extending substantially parallel to one another and to the data lines, the power lines alternating with the data lines; and
an array of organic light emitting diodes (OLEDs), each of the OLEDs comprising a first pixel electrode, a second pixel electrode overlying the first pixel electrode, and an organic light emitting layer interposed between the first and second pixel electrodes, the first pixel electrode comprising a layer formed of a substantially opaque material,
wherein the first pixel electrode of each OLED extends across at least the entire width of one of the plurality of data lines, and wherein the first pixel electrode extends so as to partially overlap two of the power lines.

13. The device of claim 12, further comprising at least one thin film transistor formed over the substrate and under the at least one first pixel electrode.

14. The device of claim 13, wherein the at least one first pixel electrode is configured to substantially block light emitting from the organic light emitting layer from reaching the thin film transistor.

* * * * *